United States Patent [19]  [11] 4,131,123
Della-Vedowa et al.  [45] Dec. 26, 1978

[54] SOLAR CELL MODULE AND METHOD OF MAKING SAME

[75] Inventors: Richard P. Della-Vedowa, Granada Hills; Ishaq M. Shahryar, West Los Angeles, both of Calif.

[73] Assignee: Solec International, Inc., Los Angeles, Calif.

[21] Appl. No.: 758,930

[22] Filed: Jan. 13, 1977

[51] Int. Cl.² .................. H01L 31/04; H01L 31/18
[52] U.S. Cl. ................................... 136/89 P; 29/572
[58] Field of Search .............. 136/89 P, 89 PC, 89 H; 29/572

[56] References Cited

U.S. PATENT DOCUMENTS

| 3,620,847 | 11/1971 | Wise | 136/89 P |
| 3,957,537 | 5/1976 | Baskett et al. | 136/89 H |
| 3,982,963 | 9/1976 | Mahoney et al. | 136/89 P |
| 4,009,054 | 2/1977 | Gochermann et al. | 136/89 P |

OTHER PUBLICATIONS

Solarex Corporation, Product Literature, Dec., 1974.

Primary Examiner—Aaron Weisstuch
Attorney, Agent, or Firm—Victor C. Muller

[57] ABSTRACT

Solar cell module and method of making same, characterized by a plurality of solar cell discs or wafers first disposed between opposite faces of an electrically insulating sheet of the same thickness as the wafers, and thence printed on both sides with electrical conducting material to provide a positive conducting face on one side of all wafers and integral solderless printed conductors between adjacent wafers and a negative grid on the other side of all wafers and integral solderless printed conductors between adjacent wafers. When the wafers are series connected, apertures are provided in the sheet through which the printing material extends to series connect adjacent wafers. The wafers may be secured within the sheet by securing same within apertures therein or elongated crystals may be disposed in a mold and electrically insulating material may be cast therearound to form a block which may then be sliced into modules.

14 Claims, 4 Drawing Figures

SOLAR CELL MODULE AND METHOD OF MAKING SAME

BACKGROUND OF THE INVENTION

A conventional solar cell for transforming light energy into electrical energy comprises a thin disc shaped crystal wafer of photovoltaic material, such as silicon, the back face of which is covered with an electrical conductive coating, and the front face of which is provided with a grid of electrical conducting material for collecting and conducting the electrical current generated from light impinging on the front face.

In a typical process of manufacturing such cell, all or a portion of the following steps may be involved:
1. Grow crystal in generally cylindrical form.
2. Machine to a right circular cylinder.
3. Saw cylinder into circular disc shaped wafers of desired uniform thickness.
4. Etch and clean.
5. Acid soak.
6. Apply diffusant.
7. Bake.
8. Diffuse (900° C. typ.)
9. Oxide etch both faces.
10. Etch back face.
11. Apply electrical conductive material to entire back face (Print, vapor deposition, or electrical plate).
12. Bake (150° C typ).
13. Apply grid to front face (process as in 11).
14. Bake (150° C typ).
15. Fire (600° C typ).
16. Test surface resistance and sort.
17. Arrange a plurality of cells in desired configuration of a module and connect the back faces and grids with wires soldered to same.
18. Arrange soldered module on face of insulated supporting base and secure thereto. (Such as by a cement).
19. Attach terminals of module by solder.
20. Test module.
21. Apply coating and sealant for protection against environment.
22. Assemble modules into an array for desired electrical output by suitable wires and soldering thereof.
23. Test.

As will be apparent from the foregoing, each cell is subjected to individual process treatment through step 16. Subsequent to step 16, at which point the individual cells are assembled into modules, tedious manual operations, involving soldered lead wires are involved, and, as will be apparent, further tedious and time consuming manual operations are reqired to assemble the modules into an array.

SUMMARY OF THE INVENTION

The present invention utilizes some of the steps previously set forth but differs therefrom in certain essential respects which effect considerable economies of manufacture, this being attained in two different exemplary manners to be subsequently described in detail, which briefly are:

In the first example, the steps may be identical to the first ten steps above set forth. At the eleventh step a desired number of cells are inserted and secured within apertures in an insulating plate of the same thickness as the cells to provide a module of desired size. Electrical conducting coating is applied to the back faces of the cells, and a grid applied to the front faces, as in the conventional method described, but differs therefrom in that (1) it is applied to a plurality of assembled cells in a single operation, rather than individually, and (2) during the application of the material it is also applied between adjacent cells (and through apertures in the plate if the cells are series connected) thus forming the requisite connections formerly provided by connecting wires having ends soldered to the cells.

In the second example, the first two steps in the formation of the cylindrical crystal are the same as heretofore. In the next step, however, they are not sliced into wafers but, on the contrary, are arranged in spaced parallel arrangement within a rectangular parallepiped mold and a hardenable electrical insulating material is cast in the mold, surrounding the crystals. After hardening, the entire block is then sliced into thin sheets, each sheet forming a module with a desired number of cells therein. Each module is then processed similar to that of the prior art and connecting leads formed between cells in the manner as described for the first example.

In both examples, the modules are preferably sandwiched and sealed between glass plates to isolate the cells and interconnections from the environment. While circular cells have been described as exemplary, they may be of other shapes such as square, rectangular, hexagonal, or other, which will hereinafter be sometimes referred to as wafers.

In accordance with the foregoing, one of the objects of the invention is to provide a solar cell module in which a plurality of wafers are disposed between opposite faces of an electrically insulating sheet and opposite faces of the sheet and wafers are thence printed with electrical conducting material to provide integral solderless connections between adjacent wafers.

Another object is to secure unprinted wafers within apertures of the sheet.

Another object is to cast hardenable electrically insulating material around a plurality of elongated crystals to form a block and thence slice the block into a plurality of modules.

Another object is to sealingly sandwich the module between transparent sheets to preclude entry of ambient environment.

Another object is to provide printed module terminals adapted to be solderlessly connected to adjacent modules of an array.

A further object is to provide novel methods of making a module.

Still further objects, advantages, and salient features will become more apparent from the detailed description to follow, the accompanying claims, and the appended drawing to now be briefly described.

DETAILED DESCRIPTION OF PREFERRED EMBODIMENTS

Figure 1:
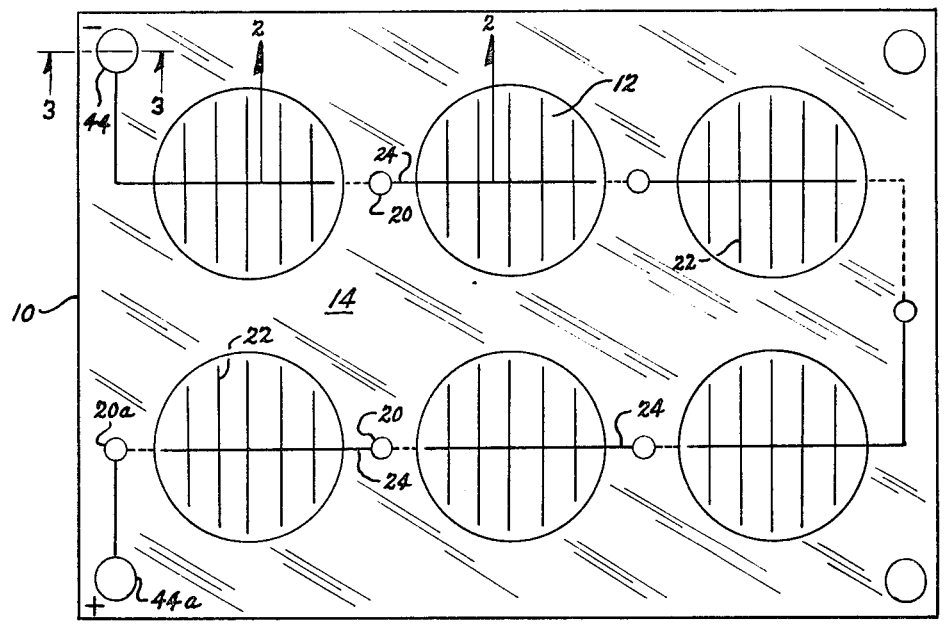
FIG. 1 is a plan of a module comprising the subject of the invention.
Figure 2:
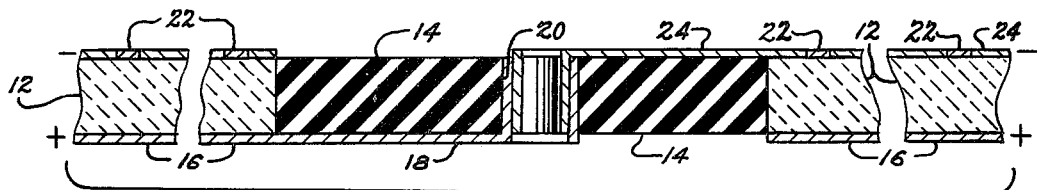
FIG. 2 is an enlarged section (not to scale) taken on line 2—2, FIG. 1.

Referring now to the drawing in detail, and first to FIGS. 1 and 2, which illustrate a module 10 forming an exemplary subject of the invention, such module comprises a plurality of thin wafers 12 disposed between opposite faces of a sheet 14 of electrical insulating material of the same thickness of the wafers so that the module is of uniform thickness at all sections thereof.

In one form of the invention, the wafers are sliced to uniform thickness from a cylindrical crystal as in the prior art, but differing therefrom, in that they are inserted into punched or otherwise formed apertures in the sheet and secured therein in any suitable manner, such as by cement, interference fit, or other.

Figure 4:
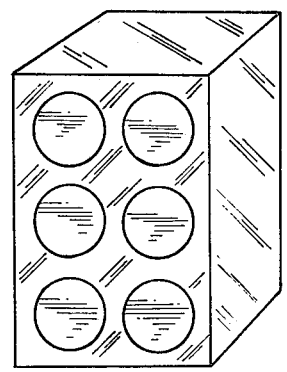
FIG. 4 is an isometric of a process step, illustrating a cast block with crystals embedded therein prior to slicing the block into sheet-like modules.

In another form of the invention, elongated crystals are disposed within a rectangular parallepiped mold in desired parallel spaced relation and a hardenable insulating material is cast in the mold, embedding the crystals therein. After hardening, the block is sliced into sheets of desired thickness of the modules. FIG. 4 illustrates such block and embedded crystals prior to slicing it into sheets.

As will be apparent, the module is essentially the same regardless of the method employed, the choice of which will depend upon the more economical method. In the first example, the crystals must be sliced into wafers, as in the prior art, and secured within apertures of sheet insulating material. In the second example, the sheet modules with wafers embedded therein are sliced from a block of cast electrical insulation material.

As illustrated, the wafers are in electrical series. To facilitate electrical connections, a coating 16 of electrical conducting material is simultaneously applied to the positive or lower faces of all wafers and also to the lower face of the sheet to form connecting leads 18 between wafers. Apertures 20 are provided through which the printed coating extends. The negative or upper faces are similarly coated to form grids 22 on the wafers and also integral leads 24 which join leads 18. If the apertures are relatively large the conducting material on one side will coat the periphery of an aperture and the conductive coating on the other side will similarly coat the inner surface of first coating, thus forming an electrical juncture within an aperture comprising thin concentric tubes, as illustrated in FIG. 2.

Thus, the grid 22(−) on the upper face of the lower left cell in FIG. 2 is connected to the lower face (+) of the lower central cell by printed connectors 18,24 which join in an aperture 20. This continues in like manner to the upper left cell, terminating at a printed ring 44. The lower face of the lower left cell is connected to a like ring 44a, extending through a like aperture 20a.

While not illustrated, the wafers may be connected in electrical paralled if so desired. In this event, the apertures may be omitted and electrical printed connectors may join all adjacent positive faces of the wafers at one face of the module and like connectors may join all adjacent grids on the opposite face thereof.

Regardless of whether connected in series or parallel, the wafers of a module will require terminals for connecting to an adjacent module if a plurality of modules are employed to form an array of electrically connected modules, an exemplary form of which will now be described.

Figure 3:
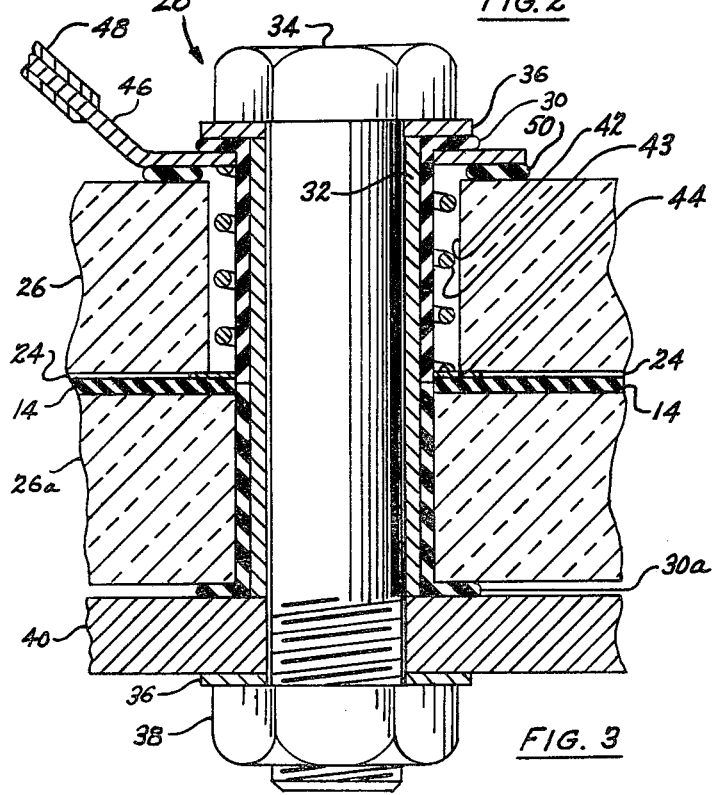
FIG. 3 is an enlarged section taken on line 3—3, FIG. 1, illustrating the module of FIG. 1, sandwiched between transparent protective plates.

Referring now to FIG. 3 each module is preferably sandwiched between a pair of glass plates 26,26a, the peripheral edges of which may be sealed by fusion or cement to prevent entry of ambient environment. Two terminals are required for each module to electrically connect it to an adjacent module in an array, one of which is illustrated in FIG. 3.

Terminal 28 comprises a pair of flanged resilient bushings, 30,30a, such as rubber or neoprene, a compression limiting bushing 32, a bolt 34, a washer 36 and a nut 38 which secures the assembly to a mounting plate or frame 40. An aperture 42 in glass plate 26 receives an electrical conducting spring 43, one end of which engages a printed terminal ring 44, previously referred to, its other end engaging a ring 46 formed on one end of a jumper connector 48, the other end of the jumper (not shown) being connected in like manner to a like terminal on an adjacent module. A rubber or neoprene ring 50 is preferably provided beneath ring 46 to prevent entry of ambient environment.

As will be apparent, the terminals just described not only form solderless electrical connections between the printed module terminals but also serve as means for securing a module to an array frame or the like. Normally, each module will be secured to the frame at at least its four corners. The same terminal construction may be employed at the other two corners as securing means, only, by omission of spring 43 and jumper 48.

What I claim is:

1. In a method of making a solar module for converting light energy to electrical energy comprising a plurality of solar cell wafers disposed in planar configuration within an electrical insulating flat spacing member, each wafer having a back face susbtantially entirely coated with electrical conducting material forming a positive terminal, and a front light receiving face with a coated collecting grid thereon formed of the electrical conducting material, forming a negative terminal, including the steps of:
   (a) orienting uncoated wafers in spaced planar relation and between opposite faces of a spacing member having substantially the same thickness of the wafers,
   (b) applying, in a single operation, electrical conducting material to the back faces of the wafers and to the spacing member in the form of first electrical connectors extending laterally from the wafers adapted to electrically connect with an adjacent wafer, and
   (c) applying, in like manner, electrical conducting material to the front faces of the wafers, but in the form of grids, and to the spacing member, in the form of second electrical connectors extending laterally from the wafers to electrically connect with an adjacent wafer.

2. A method in accordance with claim 1 including the prior steps of successively slicing the wafers from a paralellepiped crystal and fabricating the spacing member with apertures therethrough for receiving the wafers therein.

3. A method in accordance with claim 1 including the prior steps in which a plurality of paralellepiped crystals are disposed in spaced parallel relation within a surrounding mould and hardenable electrical insulation is cast in the mould to surround the crystals and thence harden to form a block, the modules thence being formed by slicing the block to form the spacing members with the wafers embedded therein.

4. A method in accordance with claim 1 including the steps of fabricating apertures through the spacing member at positions between adjacent wafers to permit the electrical conducting material to enter same and join the first and second connectors thereat with adjacent wafers in electrical series.

5. A method in accordance with claim 1 including the step of encapsulating the module between two plates of material, at least the plate adjacent the light receiving face being transparent glass, and sealing the edges of the plates to prevent entry of ambient environment.

6. A method in accordance with claim 5 wherein the module is encapsulated between two plates of glass and the sealing is effected by fusing the edges thereof together, forming an integral glass encapsulation.

7. A solar module for converting light energy to electrical energy comprising a plurality of solar cell wafers disposed in planar configuration within an electrical insulating flat spacing member, each wafer having a back face substantially entirely coated with electrical conducting material forming a positive terminal, and a front light receiving face with a coated collecting grid thereon formed of the electrical conducting material, forming a negative terminal, (a) said wafers being oriented in spaced relation and between opposite faces of the spacing member, the spacing member being substantially the same thickness of the wafers, (b) the electrical conducting material being applied, in a single operation, to the back faces of the wafers and to the spacing member in the form of first electrical conductors extending laterally from the wafers adapted to electrically connect with an adjacent wafer, and (c) the electrical conducting material being applied, in like manner, to the front faces of the wafers, but in the form of grids, and to the spacing member, in the form of second electrical conductors extending laterally from the wafers adapted to electrically connect with an adjacent wafer.

8. Apparatus in accordance with claim 7 wherein the wafers are sliced from a parallelepiped crystal and the spacing member is provided with apertures therethrough for receiving the wafers therein.

9. Apparatus in accordance with claim 7 wherein each module is formed as a slice of a block formed of cast and hardened electrical insulating material in which is embedded parallel spaced parallelepiped crystals.

10. Apparatus in accordance with claim 7 including apertures through the spacing member at positions between adjacent wafers to permit the electrical conducting material to enter same and join the first and second connectors thereat with adjacent wafers in electrical series.

11. Apparatus in accordance with claim 7 including two plates of material between which the module is encapsulated, at least the plate adjacent the light receiving face being transparent glass, and means sealing the edges of the plates to prevent entry of ambient environment.

12. Apparatus in accordance with claim 11 wherein both plates are glass and the edges thereof are fuse sealed together, forming an integral glass encapsulation.

13. Apparatus in accordance with claim 11 including a plurality of spaced bolts entending through both plates and the spacing member for securing a module to a frame or the like, and means for preventing entry of ambient environment into the space between said plates.

14. Apparatus in accordance with claim 13 including an electrical conductor disposed adjacent a bolt and connecting a printed module terminal on said spacing member to an external jumper disposed between adjacent modules.

* * * * *